(12) United States Patent
Montalvo et al.

(10) Patent No.: US 7,424,066 B2
(45) Date of Patent: Sep. 9, 2008

(54) RECEIVER STRUCTURES FOR SELECTABLE DIRECT CONVERSION AND LOW INTERMEDIATE FREQUENCY OPERATIONAL MODES

(75) Inventors: Antonio J. Montalvo, Raleigh, NC (US); Corey Petersen, Poway, CA (US)

(73) Assignee: Analog Devices, Inc., Norwood, MA (US)

( * ) Notice: Subject to any disclaimer, the term of this patent is extended or adjusted under 35 U.S.C. 154(b) by 729 days.

(21) Appl. No.: 11/040,690

(22) Filed: Jan. 21, 2005

(65) Prior Publication Data

US 2006/0165196 A1   Jul. 27, 2006

(51) Int. Cl.
  *H03D 3/00*   (2006.01)
  *H03K 9/06*   (2006.01)
(52) U.S. Cl. .................................................. 375/322
(58) Field of Classification Search ................. 375/322
   See application file for complete search history.

(56) References Cited

U.S. PATENT DOCUMENTS

| | | | | |
|---|---|---|---|---|
| 4,944,025 | A * | 7/1990 | Gehring et al. | 455/207 |
| 6,014,366 | A * | 1/2000 | Ichiyoshi | 370/210 |
| 6,240,274 | B1 | 5/2001 | Izadpanah et al. | 455/39 |
| 6,275,542 | B1 * | 8/2001 | Katayama et al. | 375/322 |
| 6,370,372 | B1 | 4/2002 | Molnar et al. | 455/323 |
| 6,545,516 | B2 | 4/2003 | Ylamurto et al. | 327/113 |
| 6,560,213 | B1 | 5/2003 | Izadpanah et al. | 370/338 |
| 6,694,131 | B1 * | 2/2004 | Lakkis | 455/302 |
| 6,745,020 | B2 * | 6/2004 | Rzyski et al. | 455/323 |
| 6,785,529 | B2 * | 8/2004 | Ciccarelli et al. | 455/324 |
| 7,209,725 | B1 * | 4/2007 | Sorrells et al. | 455/333 |
| 2003/0078011 | A1 * | 4/2003 | Cheng et al. | 455/73 |

OTHER PUBLICATIONS

Rigge, Lawrence, "802.11 Wireless Chip Set Technology White Paper", Agere Systems, Allentown, PA, Mar. 2003, 12 pages.

* cited by examiner

*Primary Examiner*—David C. Payne
*Assistant Examiner*—Nader Bolourchi
(74) *Attorney, Agent, or Firm*—Koppel, Patrick, Heybl & Dawson

(57) ABSTRACT

Receiver embodiments are disclosed that can process a wide range of transmission bandwidths over a wide range of transmission frequencies and provide reduced converter sampling rates, filter bandwidths, and filter tuning ranges and enhanced signal-to-noise performance. They convert transmission signals with quadrature local oscillator signals whose frequencies are commanded to be a selected transmission frequency when a selected transmission bandwidth is above a predetermined bandwidth threshold and are commanded to be offset from the selected transmission frequency by an intermediate frequency that is at least one half of the selected transmission bandwidth when the selected transmission bandwidth is below the bandwidth threshold.

19 Claims, 3 Drawing Sheets

US 7,424,066 B2

RECEIVER STRUCTURES FOR SELECTABLE DIRECT CONVERSION AND LOW INTERMEDIATE FREQUENCY OPERATIONAL MODES

BACKGROUND OF THE INVENTION

1. Field of the invention

The present invention relates generally to receiver architectures.

2. Description of the Related Art

Modern communication systems often require operation with a wide range of transmission bandwidths that are carried over a wide range of transmission frequencies. Receivers in these demanding environments have generally required complex, costly receiver structures because of their excessive converter sampling rates, filter bandwidths, and filter tuning ranges.

BRIEF SUMMARY OF THE INVENTION

The present invention is directed to receiver methods and structures that enhance receiver performance over wide ranges of transmission frequency and transmission bandwidth. The novel features of the invention are set forth with particularity in the appended claims. The invention will be best understood from the following description when read in conjunction with the accompanying drawings.

DETAILED DESCRIPTION OF THE INVENTION

Figure 1:
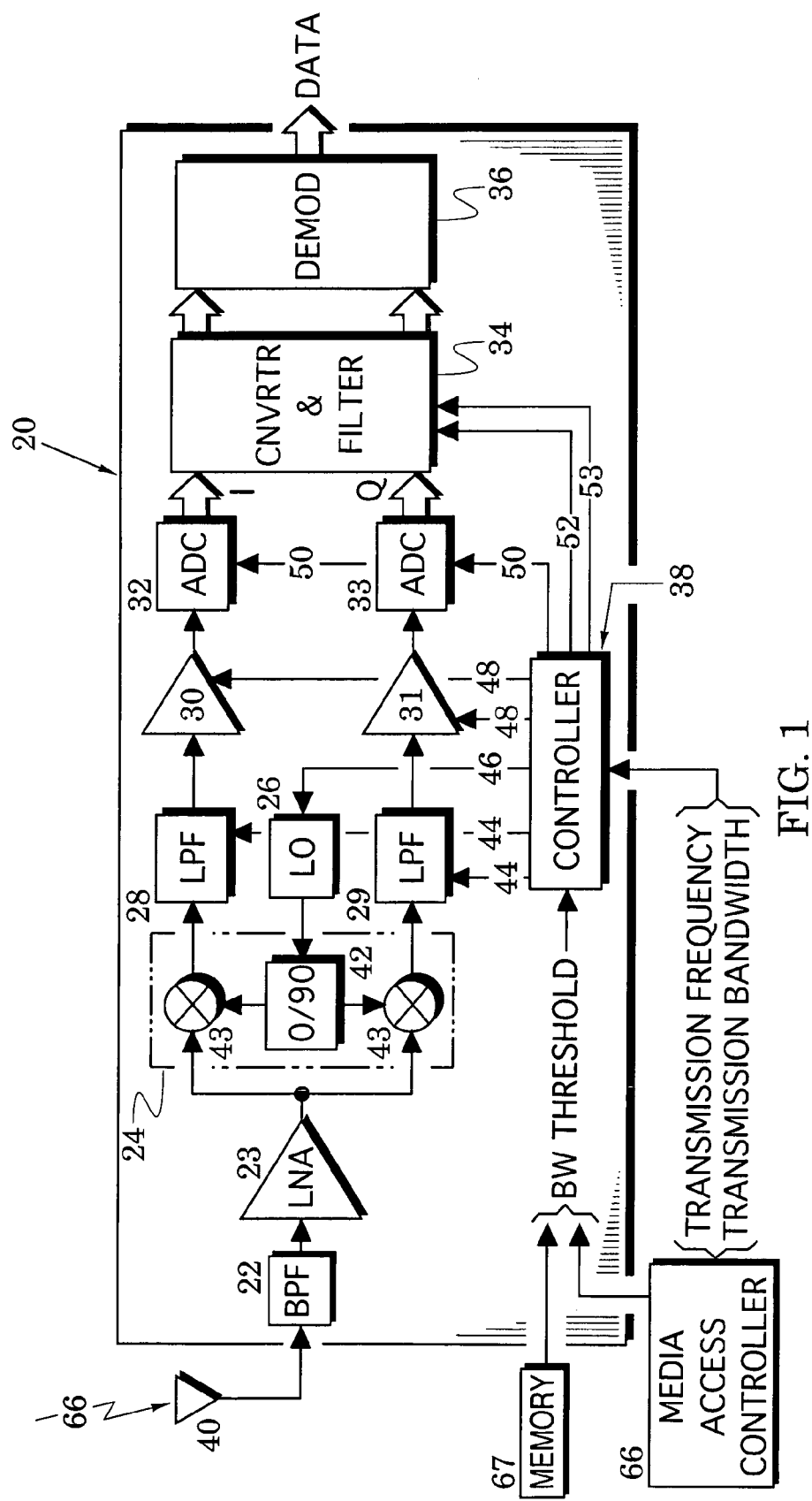
FIG. 1 is a block diagram of a receiver embodiment of the present invention.

FIGS. 1-6 illustrate receiver embodiments that provide substantial advantages which include reduced converter sample rates, reduced filter bandwidths, reduced filter tuning ranges and reduction of 1/f noise degradation. In particular, FIG. 1 illustrates a receiver embodiment 20 which includes a pre-select filter 22, a low-noise amplifier (LNA) 23, a quadrature mixer 24, a local oscillator (LO) 26, I and Q analog filters 28 and 29, I and Q analog amplifiers 30 and 31, I and Q analog-to-digital converters (ADC) 32 and 33, a converter/filter module 34, a demodulator 36 and a controller 38.

The pre-select filter 22 is coupled to an external antenna 40 and the LNA 23 is coupled between the pre-select filter and two input ports of the mixer 24. The LO drives an input of the mixer 24 and the I and Q analog filters 28 and 29 are respectively coupled between the I and Q amplifiers 30 and 31 and the LO. The I and Q converters 32 and 33 are respectively coupled between the I and Q analog amplifiers 30 and 31 and the converter/filter module 34. Finally, the demodulator 36 provides data in response to signals from the converter/filter module 34.

The mixer 24 is formed with a quadrature (0/90°) signal splitter 42 that is coupled between mixers 43. The controller 38 has access to a bandwidth (BW) threshold signal, receives signals that indicate selected transmission frequency and transmission bandwidth, and provides command signals which include commands 44 to the I and Q analog filters, a command 46 to the LO, command 48 to the I and Q analog amplifiers, command 50 to the I and Q converters and commands 52 and 53 to the converter/filter module 34.

The selected transmission frequency and transmission bandwidth may be provided, for example, by a media access controller (MAC) 66 in a communications system that includes a number of receivers. The bandwidth threshold signal may, for example, be stored in a memory 67 or provided by the MAC.

Figure 2:
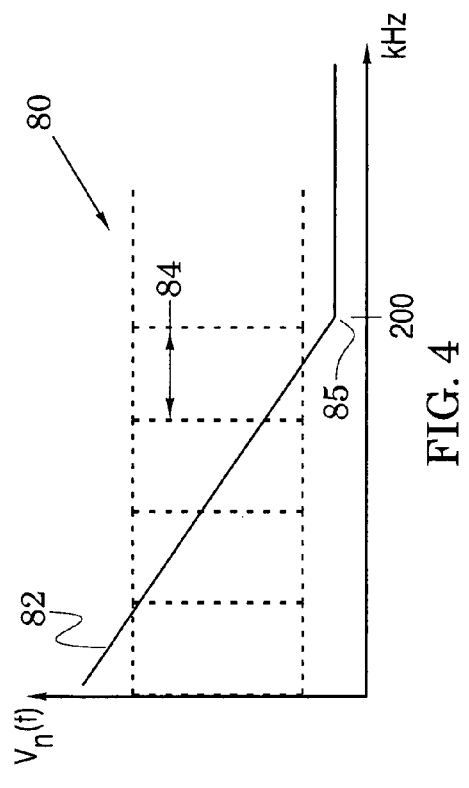
FIG. 2 is a block diagram of a converter/filter embodiment in the receiver of FIG. 1.

FIG. 2 shows that the converter/filter 34 includes a digital adder 54, a digital phase shifter 55, first and second digital multipliers 56 and 57, first and second multiplexers 58 and 59 and first and second digital filters 62 and 63. The multipliers are coupled between A ports of the multiplexers and the adder 54. The adder receives signals directly from one of the converters and receives signals from the other converter via the phase shifter 55. B ports of the multiplexers receive signals from the I and Q converters (32 and 33 in FIG. 1). The first and second digital filters 62 and 63 are respectively coupled between the first and second multiplexers and the demodulator 36. At this point, it is noted that broad, white arrows are used in FIGS. 1 and 2 to distinguish digital processing paths from analog signal paths.

In basic operation of the receiver structures of FIGS. 1 and 2, the transmission signal 66 passes through the antenna 40 and pre-selector filter 22 to be amplified in the LNA 23 and then applied to the mixers 43 to provide I and Q analog signals wherein the designations I and Q generally refer to signals that have a quadrature relationship. After filtering and amplification in the I and Q analog filters 28 and 29 and I and Q amplifiers 30 and 31, the I and Q analog signals are converted in the I and Q converters 32 and 33 to I and Q digital signals.

In a first operational mode of the module 34 of FIG. 2, the I and Q digital signals from the I and Q converters are multiplexed through the multiplexers 60 and 61 to the first and second digital filters 62 and 63. In a second operational mode, a sum of the I and Q digital signals is processed through the first and second digital multipliers 56 and 57 to generate first and second downconverted signals that are then multiplexed through the multiplexers 60 and 61 to the demodulator 36 for demodulation. These modes are selected by the controller 38 which commands processing paths through the multiplexers 60 and 61 via the command signal 52.

The demodulator 36 receives signals from the first and second digital filters 62 and 63 and demodulates and decodes these signals to recover the data was encoded onto a transmission signal 66 which is shown as it is received by the antenna 40 in FIG. 1. The demodulator is typically configured to demodulate specific modulation modes such as orthogonal frequency-division multiplexing (OFDM) and orthogonal frequency-division multiplexing access (OFDMA). In addition, the demodulator makes use of the quadrature relationship in the signals (established by the quadrature mixer 24 of FIG. 1) to enhance reception of the transmission signal 66 relative to an image signal located on the other side of the frequency of the local oscillator signal (provided by the local oscillator 26).

Figure 3B:
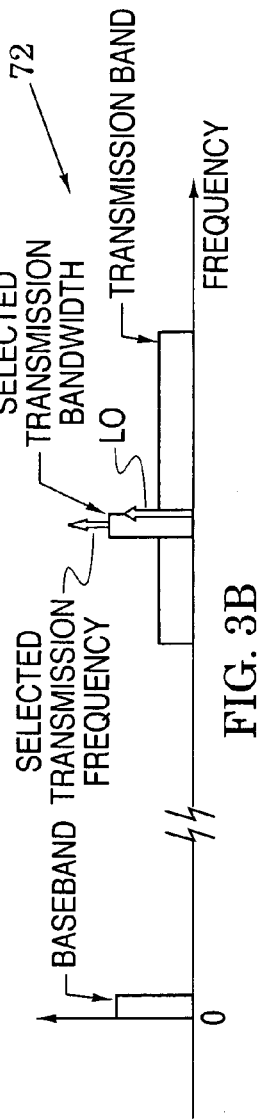
FIGS. 3A and 3B are frequency diagrams that illustrate receive processes in the receiver of FIG. 1.
Figure 3A:
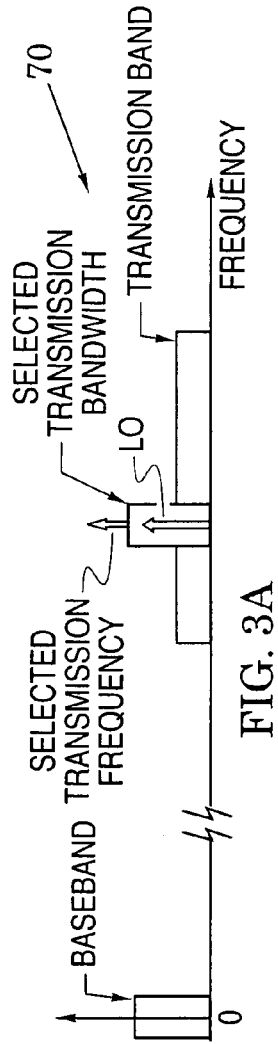

Operational modes of the receiver 20 of FIGS. 1 and 2 can be investigated with aid of the frequency diagrams 70 and 72 of FIGS. 3A and 3B. FIG. 3A illustrates that the transmission signal 66 of FIG. 1 may be located anywhere in a specified transmission band. For example, the receiver 20 can be used in accordance with the 802.16 standard for metropolitan area networks that was developed by the Institute of Electrical and Electronics Engineers (IEEE). This standard applies to the 2-11 GHz communication region and specifies transmission bands such as 2.1-2.5, 3.4-3.7, 5.18-5.32 and 5.745-5.805 GHz. The 802.16 standard also specifies transmission bandwidths such as 1.75, 3, 3.5, 5, 5.5, 7, 10 and 14 MHz for the OFDM mode and transmission bandwidths as low as 1.75 MHz and as high as 25 MHz for the OFDMA mode. These bandwidths are further divided into a large number (e.g., 256) of subcarrier bands.

FIG. 3A indicates a selected transmission frequency that has been selected from the transmission band and a selected transmission bandwidth that has been selected from the available bandwidths. As described above relative to FIG. 1, these selections are provided to the controller 38.

In response, the controller 38 determines that the selected bandwidth is above the predetermined bandwidth threshold and commands (via command signal 46) the frequency of the LO 26 to be the same as the selected transmission frequency that is indicated in FIG. 3A. Accordingly, transmission signals in the transmission bandwidth are translated in the quadrature mixer (24 in FIG. 1) to a baseband that is centered about 0 Hz as indicated by the baseband in FIG. 3A.

The controller 38 commands (via command signal 52) the multiplexers 60 and 61 to pass signals in the baseband of FIG. 3A from the I and Q converters 32 and 33 for filtering in the first and second digital filters 62 and 63. The filtered signals pass to the demodulator 36 of FIG. 1 which recovers the data. In its processing, the demodulator uses the quadrature relationship of the baseband signals to prevent the negative portion from folding over and superposing on the positive portion.

The controller may also provide the command signals 44 which select the passband of the analog filters 28 and 29. For example, the filters 28 and 29 may be active RC filters (resistor and capacitor elements associated with a gain element such as differential amplifier) whose passband can be easily selected. Because the selected transmission bandwidth has been translated about 0 Hz, the passbands of the filters 28 and 29 can be commanded to be substantially one half the selected transmission bandwidth of FIG. 3A.

The controller may also provide the command signal 50 which selects a sampling rate in the I and Q converters 32 and 33 and provide the command signal 53 which selects the passband of the digital filters 62 and 63. The passbands of the digital filters 62 and 63 can be set at substantially one half the selected transmission bandwidth of FIG. 3A. It is noted that the pre-select filter 22 of FIG. 1 may be realized as a bandpass filter (BPF) whose passband includes the transmission band.

In contrast to FIG. 3A, FIG. 3B indicates a selected transmission bandwidth that is significantly narrower than that of FIG. 3A. In particular, the controller 38 determines that the selected bandwidth is now below the predetermined bandwidth threshold (BW THRESHOLD in FIG. 1) and commands (via command signal 46) the frequency of the local oscillator 26 to be offset from the selected transmission frequency by an intermediate frequency that is at least one half of the selected transmission bandwidth.

In FIG. 3B, it is assumed that the local oscillator frequency was offset by exactly one half the selected transmission bandwidth so that signals in the transmission bandwidth are translated in the quadrature mixer (24 in FIG. 1) to a baseband which abuts 0 Hz. As indicated in FIG. 2, a sum of the I and Q digital signals from the I and Q converters 32 and 33 is multiplied in the first and second digital multipliers 56 and 57 by cosine and sine of the intermediate frequency (difference between the transmission frequency and the LO frequency).

In this operation, one of the I and Q digital signals is phase shifted by 90° in the phase shifter 55. The controller 38 also commands (via command signal 52) the multiplexers 60 and 61 to pass signals from the first and second multipliers 56 and 57 for filtering in the first and second digital filters 62 and 63.

Because the selected transmission bandwidth has been translated to abut 0 Hz, the passbands of the analog filters 28 and 29 can be commanded to be substantially the selected transmission bandwidth of FIG. 3B. The baseband relationships shown in FIGS. 3A and 3B indicate that the I and Q analog filters of FIG. 1 can typically be realized as lowpass filters (LPF).

The controller may also provide the command signal 50 which selects a sampling rate in the I and Q converters 32 and 33 and provide the command signal 53 which selects the passband of the digital filters 62 and 63. Because of the digital downconversion of the multipliers 56 and 57, the passbands of the digital filters 62 and 63 can be set to be substantially one half the selected transmission bandwidth of FIG. 3B.

The operational mode described above with reference to FIG. 3A directly converts the transmission signal (66 in FIG. 1) to baseband. Because the selected transmission bandwidth has been translated about 0 Hz, the signal bandwidth processed by I and Q filters 28 and 29, the I and Q analog amplifiers 30 and 31, and the I and Q converters 32 and 33 has been reduced. Accordingly, the controller 38 can command (via command signals 44, 48 and 50) reduced bandwidths in the filters and the amplifiers and reduced sample rates in the I and Q converters 32 and 33. This significantly reduces the cost and complexity of these elements and also reduces their operational current demands.

Unfortunately, this direct conversion immediately converts the transmission signal about 0 Hz so that it is especially sensitive to 1/f noise. It has been found, for example, that typical complementary metal-oxide-semiconductor (CMOS) realizations of direct-conversion receivers have a noise corner between 1/f noise and thermal noise of approximately 200 kHz as illustrated by plot 82 in the graph 80 of FIG. 4.

It has been determined, however, that 1/f noise does not substantially degrade direct-conversion performance when four subcarrier bandwidths approximately equal or exceed the noise corner. In an OFDM example in which the selected bandwidth is 12 MHz and there are 256 subcarriers, four subcarrier bandwidth is on the order of 188 KHz so that this bandwidth and greater bandwidths can be effectively processed by the direct conversion structure without significant 1/f degradation. This subcarrier relationship is indicated in FIG. 4 where four subcarrier bandwidths 84 nearly equal the 1/f corner 85.

Figure 4:
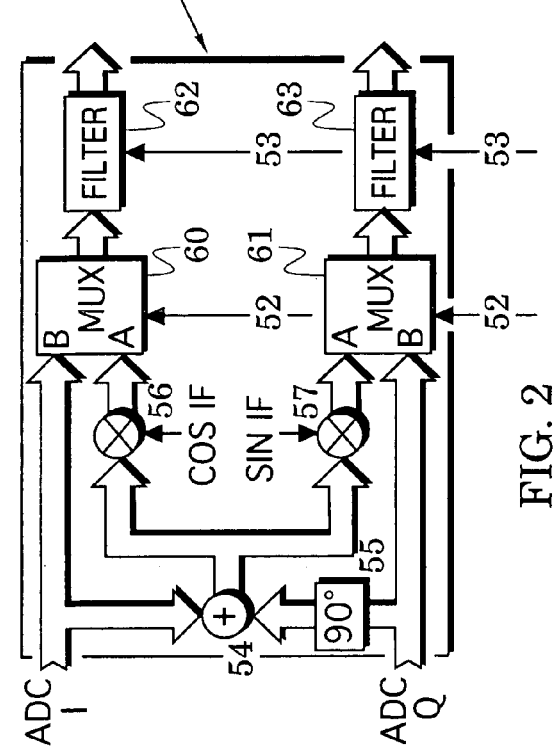
FIG. 4 is a diagram that compares bandwidths of transmission subcarriers to a noise corner of the receiver of FIG. 1.

When the selected transmission bandwidth drops sufficiently so that the relationship indicated in FIG. 4 is no longer valid, the controller 38 of FIG. 1 preferably commands the receiver 20 to shift to its low intermediate frequency (low IF) operational mode which is shown in FIG. 3B. In this mode, the local oscillator signals of the local oscillator (26 in FIG. 1) are offset by at least one half of the selected transmission bandwidth. Preferably, they are offset by exactly one half of the selected transmission bandwidth so that the transmission signals are translated to abut 0 Hz. In the low-IF operational mode of FIG. 3B, the 1/f noise degradation is effectively reduced.

The controller 38 of FIG. 1 achieves this selection between the direct-conversion operational mode exemplified in FIG. 3A and the low-IF operational mode exemplified in FIG. 3B. In particular, it achieves this selection by comparing the selected transmission bandwidth with a predetermined bandwidth threshold as indicated in FIG. 1. If the selected transmission bandwidth exceeds the bandwidth threshold, the controller issues command signals to achieve the direct-conversion operational mode of FIG. 3A. If, however, the bandwidth threshold exceeds the selected transmission bandwidth, the controller issues command signals to achieve the low-IF operational mode of FIG. 3B.

Figure 5:
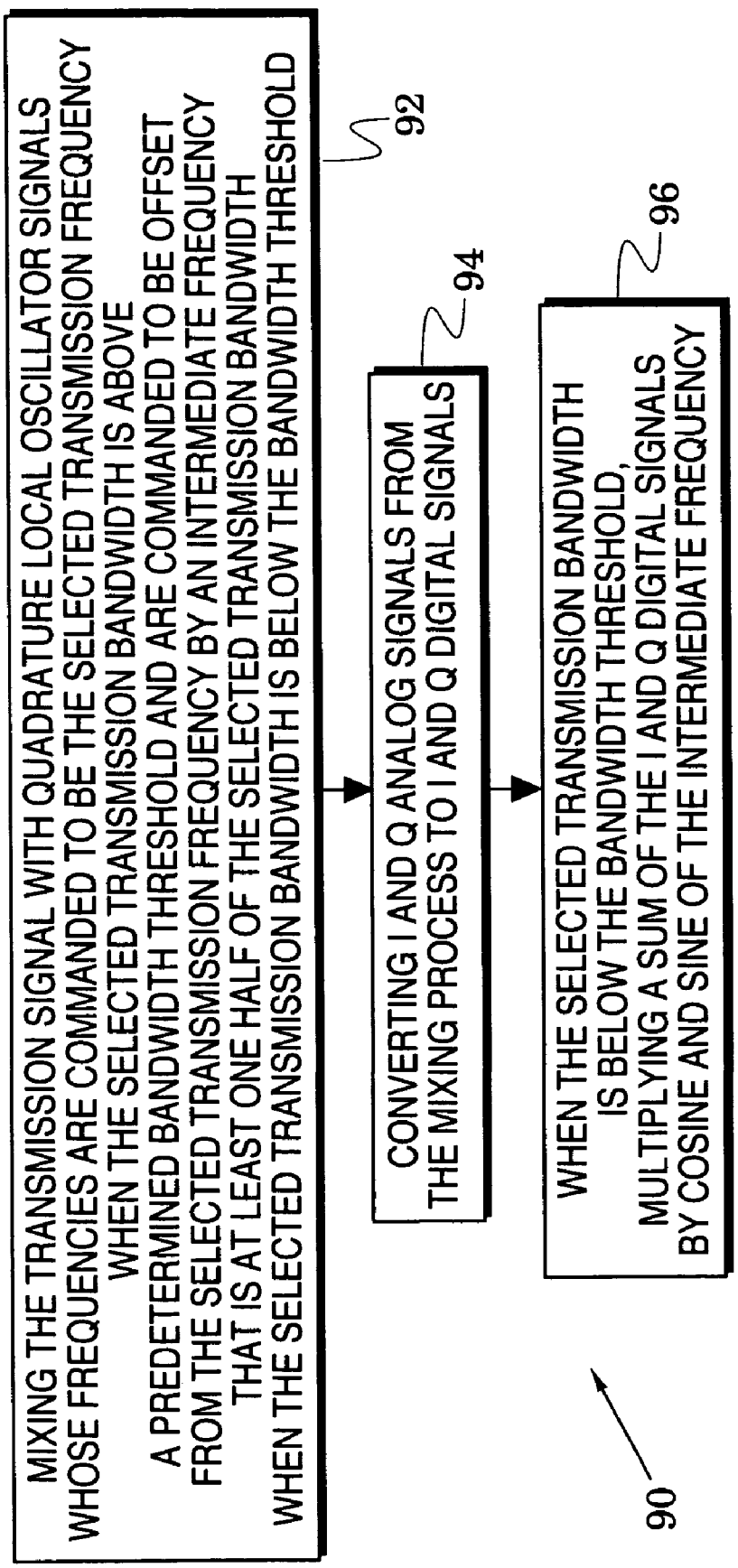
FIG. 5 is a flow chart that recites operational processes in the receiver of FIG. 1.

This operation is shown in the flow chart 90 of FIG. 5 in which a process 92 mixes the transmission signal with quadrature local oscillator signals whose frequencies are commanded to be the selected transmission frequency when the selected transmission bandwidth is above a predetermined bandwidth threshold and are commanded to be offset from the selected transmission frequency by an intermediate frequency that is at least one half of the selected transmission bandwidth when the selected transmission bandwidth is below the bandwidth threshold.

Process 94 then converts I and Q analog signals from the mixing step 92 to I and Q digital signals. Lastly, when the selected transmission bandwidth is below the bandwidth threshold, process 96 multiplies a sum of the I and Q digital signals by cosine and sine of the intermediate frequency. This last process is accomplished with the summer 54 and digital multipliers 56 and 57 of FIG. 2. In addition, one of the I and Q digital signals is phase shifted by the phase shifter 55 of FIG. 2 and the multiplied signals are multiplexed to the first and second digital filters (62 and 63 in FIG. 2) by the first and second multiplexers (60 and 61 in FIG. 2).

Because the controller 38 of FIG. 1 commands the local oscillator frequency to the frequency of the transmission frequency when the selected transmission bandwidth is above the predetermined bandwidth threshold, the sample rates of the I and Q converters (32 and 33 in FIG. 1) can be reduced and the bandwidths and tuning range of the first and second analog filters (28 and 29 in FIG. 1) can be reduced.

Because the controller 38 of FIG. 1 commands the local oscillator frequency to be offset from the frequency of the transmission frequency when the selected transmission bandwidth is below the predetermined bandwidth threshold, the degrading effect of 1/f noise is substantially reduced. In various receiver embodiments, the controller may be formed with an array of gates, an appropriately-programmed processor or a combination thereof.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A receiver for processing a transmission signal that has a transmission frequency and a selectable transmission bandwidth, the receiver comprising:
   a local oscillator that provides a local oscillator signal;
   a quadrature mixer that provides I and Q analog signals in response to said transmission signal and said local oscillator signal;
   I and Q converters that convert said I and Q analog signals to I and Q digital signals;
   first and second digital multipliers; and
   a controller configured to:
   a) when said transmission bandwidth is selected to be above a predetermined bandwidth threshold, command the frequency of said local oscillator signal to be said transmission frequency; and
   b) when said transmission bandwidth is selected to be below said bandwidth threshold, command the frequency of said local oscillator signal to be offset from said transmission frequency by an intermediate frequency that is at least one half of said transmission bandwidth and command said first and second multipliers to each multiply a sum of said I and Q digital signals by cosine and sine of said intermediate frequency;
   and further including:
   first and second digital filters; and
   first and second multiplexers;
   wherein said controller is configured to:
   a) when said transmission bandwidth is above said bandwidth threshold, command said first and second multiplexers to respectively direct signals from said I and Q converters to said first and second digital filters; and
   b) when said transmission bandwidth is below said bandwidth threshold, command said first and second multiplexers to respectively direct signals from said first and second multipliers to said first and second digital filters.

2. The receiver of claim 1, further including a digital adder coupled to said I and Q converters to provide said sum to said first and second multipliers.

3. The receiver of claim 2, further including a digital phase shifter inserted between said adder and one of said I and Q converters.

4. The receiver of claim 1, wherein:
   said transmission signal includes subcarriers that each have a subcarrier bandwidth wherein four times said subcarrier bandwidth exceeds 200 kilohertz; and
   said bandwidth threshold is substantially four times said subcarrier bandwidth.

5. The receiver of claim 1, wherein said controller is configured to command the bandwidth of said first and second digital filters to be substantially one half of said transmission bandwidth.

6. The receiver of claim 1, further including I and Q analog filters respectively inserted between said I and Q converters and said mixer wherein said controller is configured to:
   a) when said transmission bandwidth is above said bandwidth threshold, set the bandwidth of said I and Q analog filters substantially to one half of said transmission bandwidth; and
   b) when said transmission bandwidth is below said bandwidth threshold, set the bandwidth of said I and Q analog filters to at least said transmission bandwidth.

7. The receiver of claim 1, further including I and Q amplifiers respectively inserted between said I and Q converters and said mixer.

8. The receiver of claim 7, wherein said controller is configured to reduce bandwidths in said I and Q amplifiers when said transmission bandwidth is above said bandwidth threshold.

9. The receiver of claim 1, wherein said controller is configured to command a sample rate in said I and Q converters when said transmission bandwidth is above said bandwidth threshold and command an decrease in said sample rate when said transmission bandwidth is below said bandwidth threshold.

10. The receiver of claim 1, further including:
    a pre-select filter; and
    a low-noise amplifier inserted between said pre-select filter and said quadrature mixer.

11. The receiver of claim 1, wherein said controller comprises at least one of an array of gates and an appropriately-programmed processor.

12. A method of processing a transmission signal that has a transmission frequency and a selectable transmission bandwidth, the method comprising the steps of:

mixing said transmission signal with quadrature local oscillator signals whose frequencies are commanded to be said transmission frequency when said transmission bandwidth is selected to be above a predetermined bandwidth threshold and are commanded to be offset from said transmission frequency by an intermediate frequency that is at least one half of said transmission bandwidth when said transmission bandwidth is selected to be below said bandwidth threshold;

converting I and Q analog signals from said mixing step to I and Q digital signals; and when said transmission bandwidth is below said bandwidth threshold, multiplying a sum of said I and Q digital signals by cosine and sine of said intermediate frequency to obtain first and second downconverted signals:

and further including the steps of:

a) when said transmission bandwidth is above said bandwidth threshold, filtering said I and Q analog signals with a filter bandwidth substantially one half of said transmission bandwidth; and b) when said transmission bandwidth is below said bandwidth threshold, filtering said I and Q analog signals with a filter bandwidth of at least said transmission bandwidth.

13. The method of claim 12, further including the step of adding said I and Q digital signals to provide said sum.

14. The method of claim 12, further including the step of phase shifting one of said I and Q digital signals prior to said multiplying step.

15. The method of claim 12, further including the steps of:

amplifying said I and Q analog signals with a first bandwidth when said transmission bandwidth is below said bandwidth threshold; and amplifying said I and Q analog signals with a second bandwidth that is reduced from said first bandwidth when said transmission bandwidth is above said bandwidth threshold.

16. The method of claim 12, further including the steps of:

a) when said transmission bandwidth is above said bandwidth threshold, digitally filtering said I and Q digital signals; and b) when said transmission bandwidth is below said bandwidth threshold, digitally filtering said first and second downconverted signals.

17. The method of claim 16, further including the step of filtering said I and Q digital signals with a filter bandwidth substantially one half of said transmission bandwidth.

18. The method of claim 12, wherein said converting step includes the steps of:

commanding a sample rate in said I and Q converters when said transmission bandwidth is above said bandwidth threshold; and commanding a decrease in said sample rate when said transmission bandwidth is below said bandwidth threshold.

19. The method of claim 12, wherein said transmission signal includes subcarriers that each have a subcarrier bandwidth and four times said subcarrier bandwidth exceeds 200 kilohertz and wherein said bandwidth threshold is substantially four times said subcarrier bandwidth.

* * * * *

UNITED STATES PATENT AND TRADEMARK OFFICE
CERTIFICATE OF CORRECTION

PATENT NO.         : 7,424,066 B2                              Page 1 of 1
APPLICATION NO.    : 11/040690
DATED              : September 9, 2008
INVENTOR(S)        : Antonio J. Montalvo and Corey Petersen It is certified that error appears in the above-identified patent and that said Letters Patent is hereby corrected as shown below:

- Column 8, Claim 16, Line 15, is written as: "downeonverted signals." It should read as: "downconverted signals."

Signed and Sealed this

Third Day of November, 2009

David J. Kappos
*Director of the United States Patent and Trademark Office*